(12) United States Patent
Jeong

(10) Patent No.: US 6,413,804 B1
(45) Date of Patent: Jul. 2, 2002

(54) METHOD OF FABRICATION OF THIN FILM TRANSISTOR

(75) Inventor: Kwoan-Yel Jeong, Kyeongsangbuk-do (KR)

(73) Assignee: LG Semicon Co., Ltd., Chungcheongbuk-Do (KR)

( * ) Notice: Subject to any disclaimer, the term of this patent is extended or adjusted under 35 U.S.C. 154(b) by 0 days.

(21) Appl. No.: 09/151,600

(22) Filed: Sep. 11, 1998

(30) Foreign Application Priority Data

Sep. 24, 1997 (KR) .............................. 97-48370

(51) Int. Cl.[7] .............................................. H01L 21/336
(52) U.S. Cl. ........................................ 438/163; 438/158
(58) Field of Search .................. 438/149, 151, 438/158, 164, FOR 200, FOR 201, 514, 517, 527, 533, 163

(56) References Cited

U.S. PATENT DOCUMENTS

| 5,508,216 | A | * | 4/1996 | Inoue | 437/40 |
|---|---|---|---|---|---|
| 5,595,944 | A | * | 1/1997 | Zhang | 437/41 |
| 5,656,511 | A | * | 8/1997 | Shindo | 438/160 |
| 5,728,604 | A | * | 3/1998 | Rha et al. | 438/158 |
| 5,923,963 | A | * | 7/1999 | Yamanaka | 438/158 |
| 5,953,582 | A | * | 9/1999 | Yudasaka | 438/29 |
| 5,989,944 | A | * | 11/1999 | Yoon | 438/149 |
| 6,010,923 | A | * | 1/2000 | Jinno | 438/158 |
| 6,017,782 | A | * | 1/2000 | Batra et al. | 438/158 |
| 6,207,481 | B1 | * | 3/2000 | Yi | 438/166 |
| 6,074,900 | A | * | 6/2000 | Yamazaki | 438/164 |
| 6,140,162 | A | * | 10/2000 | Yeo | 438/155 |
| 6,156,628 | A | * | 12/2000 | Ohnuma | 438/486 |
| 6,197,624 | B1 | * | 3/2001 | Yamazaki | 438/158 |
| 6,232,158 | B1 | * | 5/2001 | Lee | 438/158 |
| 6,235,558 | B1 | * | 5/2001 | Oda | 438/142 |

* cited by examiner

Primary Examiner—Mary Wilczewski
(74) Attorney, Agent, or Firm—Morgan, Lewis & Bockius LLP

(57) ABSTRACT

A method of fabricating a thin film transistor includes the steps of forming an active layer on a substrate, forming a gate insulating layer covering the active layer and the substrate, forming a gate on a portion of the gate insulating layer and over the active layer, forming an insulating interlayer on the gate insulating layer to cover the gate, forming contact holes exposing a portion of the active layer by patterning the insulating interlayer and the gate insulating layer, and forming a heavily doped region by heavily doping the portion of the active layer exposed by the contact holes.

6 Claims, 5 Drawing Sheets

METHOD OF FABRICATION OF THIN FILM TRANSISTOR

This application claims the benefit of Korean Patent Application No. 97-48370, filed Sep. 24, 1997, which is hereby incorporated by reference.

BACKGROUND OF THE INVENTION

1. Field of the Invention

The present invention relates to a fabrication method of a thin film transistor (TFT) for a liquid crystal display (LCD), and more particularly, to a TFT that draws less leakage current.

2. Discussion of the Related Art

A basic unit of an LCD includes a switching device (TFT) that drives a pixel having a pixel electrode. The TFTs and the pixels are arrayed in a matrix. The TFT includes a gate, a source and a drain. The gate is formed in an active region that includes polycrystalline silicon or amorphous silicon. TFTs are classified into two types: a top gate type and a bottom gate type, where the top gate type has a gate in an upper part of the active region, and the bottom gate type has a gate in a lower part of the active region.

Depending on a shape of the gate, TFTs are classified into a standard type and a dual gate type. The TFTs are also classified into a lightly doped drain (LDD) type and an offset type depending on the relative locations of a source region, a drain region and a gate region.

TFTs of the LDD type and the offset type reduce the leakage current because they have an active layer made of polycrystalline silicon and a structure where the source, the drain and the gate do not overlap. The LDD-type TFT has a region doped lightly with impurities between a source/drain region and the gate in the active layer, while the offset-type TFT does not have such a corresponding doped region.

FIGS. 1A to 1D show a conventional fabricating method of the TFT. Referring to FIG. 1A, an active layer 13 is formed by patterning a silicon layer using photolithography. The silicon layer has been deposited on a substrate 11 and includes undoped amorphous silicon or polycrystalline silicon. A gate insulating layer 15 is formed by depositing silicon oxide to cover the active layer 13.

Referring to FIG. 1B, a gate 17 is formed by patterning an aluminum layer that has been deposited on the gate insulating layer 15 using photolithography, where a portion of the aluminum layer remains over a center portion of the active layer 13. A lightly doped region 19 making up an LDD structure is formed by lightly doping with N-type impurities a region that does not overlap the active layer 13, with the gate 17 being used as a mask. The undoped portion of the active region 13 under the gate 17 becomes a channel region of the TFT. When an offset type TFT is formed, the active layer 13 is not doped with impurities.

Referring to FIG. 1C, side walls 21 are formed at sides of the gate 17 by etching back a silicon oxide layer which has been deposited to cover the gate on the gate insulating layer 15. Using the gate 17 and the side walls 21 as a mask, a heavily doped region 23 used as source and drain regions is formed by doping it heavily with N-type impurities. If the lightly doped region 19 is not formed, the region 19 between the gate 17 and the heavily doped region 23 becomes an offset region.

Referring to FIG. 1D, an insulating interlayer 25 is formed by depositing silicon oxide to cover the gate 17 and the side walls 21 on the gate insulating layer 15. Contact holes 27 are formed by patterning the insulating interlayer 25 using photolithography to expose the heavily doped region 23. A source electrode 28 and a drain electrode 29 are formed in contact with the heavily doped region 23.

FIG. 2 shows a cross-sectional view of additional steps in the fabrication of the TFT.

After the steps shown in FIGS. 1A to 1B have been carried out, a heavily doped region 23 for use as source and drain regions is formed by heavily doping it with N-type impurities and using a mask 22 covering an area bigger than the top surface of the gate 17, which is located in the center. The width of the lightly doped region 19 between the gate 17 and the highly doped region 23 depends on the width of the mask 22 as shown in FIG. 2. Then the steps shown in FIG. 1D are performed.

In the conventional fabricating method of the TFT, the length of the lightly doped region and the length of the offset region should be limited to no more than 2 μm. Accordingly, the process becomes complicated due to an added step of forming sidewalls to define the lightly doped region and the offset region. Also, defining the width of the side walls 21 to more than or equal to 2 μm is difficult.

In addition, the process gets more complicated when the lightly doped region or the offset region is defined by aligning a mask.

SUMMARY OF THE INVENTION

Accordingly, the present invention is directed to a fabrication method of a thin film transistor (TFT) for a liquid crystal display (LCD) that substantially obviates one or more of the problems due to the limitations and disadvantages of the related art.

An object of the present inventions to provide a simple process for defining a lightly doped region or an offset region without using a mask or side walls.

Additional features and advantages of the present invention will be set forth in the description which follows, and will be apparent from the description, or may be learned by practice of the invention. The objectives and other advantages of the invention will be realized and attained by the structure and process particularly pointed out in the written description as well as in the appended claims.

To achieve these and other advantages and in accordance with the purpose of the present invention, as embodied and broadly described, in a first aspect of the present invention there is provided a method of fabricating a thin film transistor including the steps of forming an active layer on a substrate, forming a gate insulating layer covering the active layer and the substrate, forming a gate on a portion of the gate insulating layer and over the active layer, forming an insulating interlayer on the gate insulating layer to cover the gate, forming contact holes exposing a portion of the active layer by patterning the insulating interlayer and the gate insulating layer, and forming a heavily doped region by heavily doping the portion of the active layer exposed by the contact holes.

In another aspect of the present invention there is provided a method of fabricating a thin film transistor including the steps of forming an active layer on a substrate, forming a gate insulating layer on the substrate and the active layer, forming a gate on a portion of the gate insulating layer and over the active layer, forming a lightly doped region by ion implantation of N-type impurities or P-type impurities and using the gate as a mask, forming an insulating interlayer on the gate insulating layer and covering the gate, forming contact holes to expose portions of the active layer by patterning the insulating interlayer and the gate insulating layer, and forming a heavily doped region by heavily doping the portions of the active layer exposed by the contact holes with the same impurities as the lightly doped region.

In another aspect of the present invention there is provided a method of fabricating a thin film transistor including the steps of forming a gate on a first area of a substrate, forming a gate insulating layer over the substrate and covering the gate, forming an active layer on the gate insulating layer covering the first area corresponding to the gate, forming an insulating interlayer on the gate insulating layer and covering the active layer, forming contact holes to expose second areas on the active layer by patterning the insulating interlayer, forming a highly doped region by highly doping the second areas.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention that together with the description serve to explain the principles of the invention.

DETAILED DESCRIPTION OF THE PREFERRED EMBODIMENT

Reference will now be made in detail to the preferred embodiments of the present invention, examples of which are illustrated in the accompanying drawings.

FIGS. 3A to 3D show a fabricating method of a thin film transistor according to the present invention.

Figure 1A:
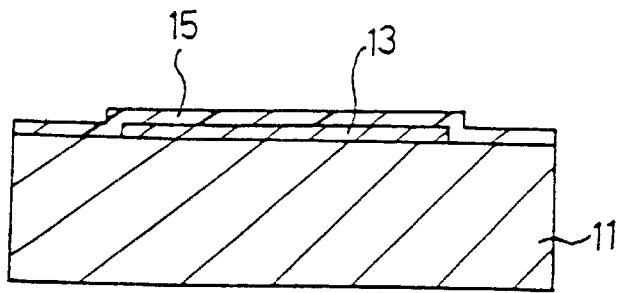
FIGS. 1A to 1D show a conventional fabricating method of a thin film transistor according to the conventional art.
Figure 1B:
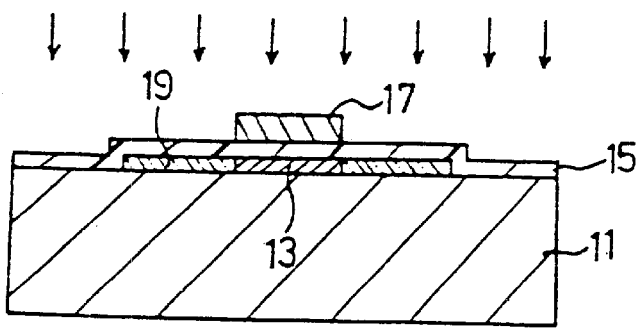
Figure 1C:
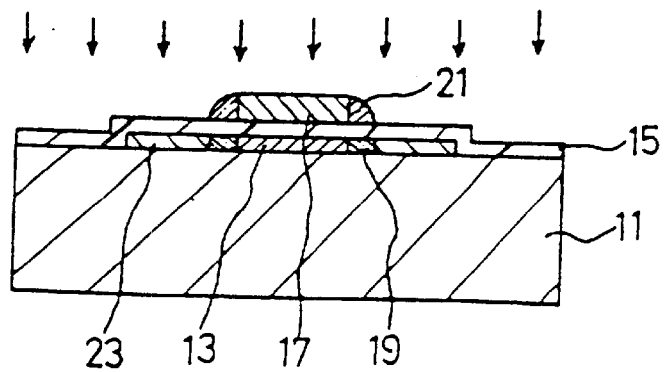
Figure 1D:
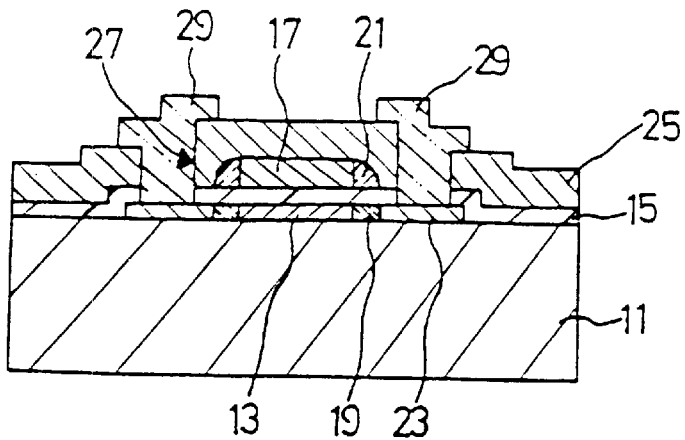
Figure 2:
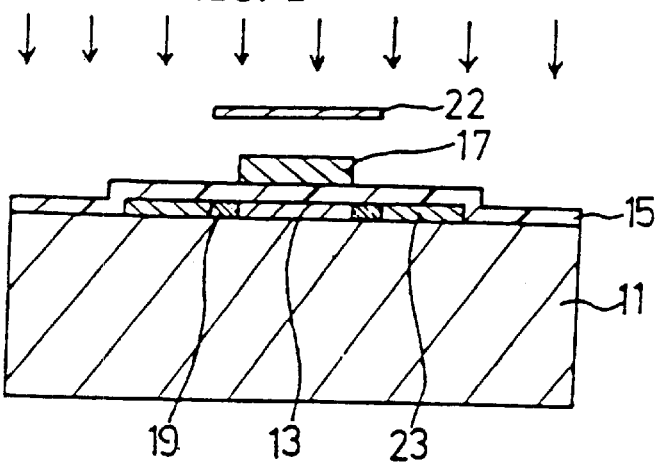
FIG. 2 shows additional fabricating steps of the conventional art.
Figure 3A:
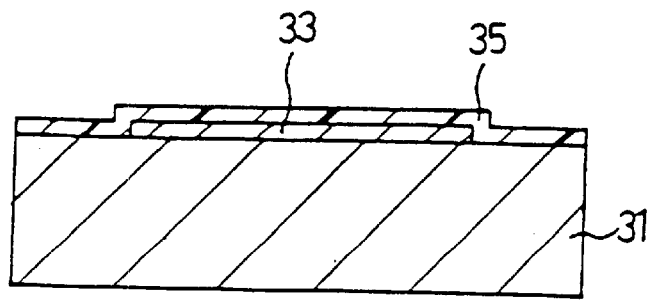
FIGS. 3A to 3D show a fabricating method of thin film transistor according to the present invention.

Referring to FIG. 3A, a silicon layer including amorphous silicon or polycrystalline silicon is deposited on a substrate 31 to a thickness of 800~1200 Å by chemical vapor deposition (CVD). An active layer 33 is defined by patterning the silicon layer using photolithography.

A gate insulating layer 35 is formed using CVD by depositing silicon oxide or silicon nitride to a thickness of 800~1200 Å on the substrate 31, covering the active layer 33.

Figure 3B:
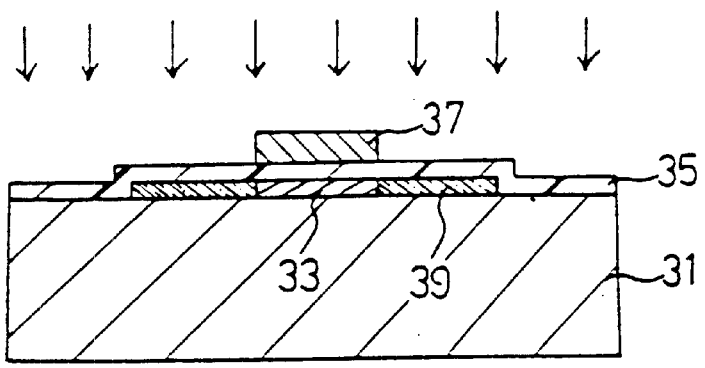

Referring to FIG. 3B, a gate 37 is formed using photolithography by patterning a conductive layer. The conductive layer has been formed to a thickness of 3000~4000 Å on the gate insulating layer 35 using CVD by depositing a conductive metal, such as aluminum, and only a portion corresponding to a center portion of the active layer 33 remains after the patterning.

A lightly doped region 39 for an LDD type TFT is formed by ion implantation of impurities at both sides of the gate 37 on the active layer 33 using the gate 37 as a mask. The N-type impurities used are arsenic or phosphorus with an implantation dose of $10^{10}$~$10^{12}$/cm$^2$. The active layer 33 under the gate 37 is undoped and becomes a channel region of the TFT. If an offset type TFT is to be formed, doping of the active layer 33 with impurities is unnecessary. The lightly doped region 39 can also be doped with $BF_2$ or B (boron).

Figure 3C:
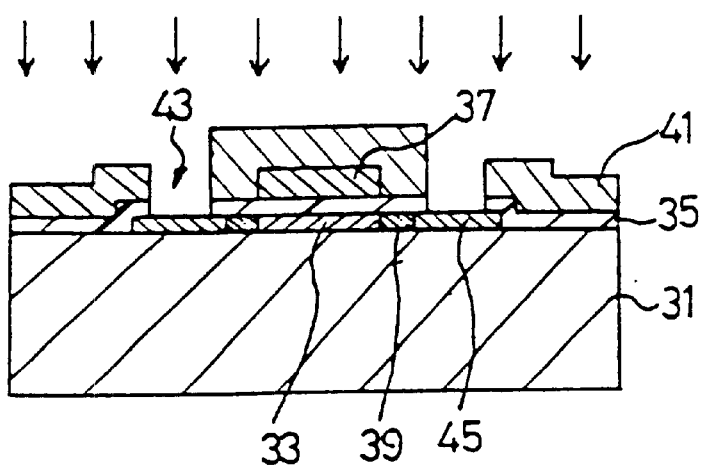

Referring to FIG. 3C, an insulating interlayer 41 is formed by depositing a thick layer of silicon oxide both on the gate 37 and on the gate insulating layer 35. Contact holes 43 are formed by patterning the insulating interlayer 41 and the gate insulating layer 35 using photolithography to expose an area of the lightly doped region 39.

Thereafter, a heavily doped region 45 is formed by implanting N-type impurity ions with an implantation dose of $10^{13}$~$10^{14}$/cm$^2$. The N-type impurities are arsenic or phosphorus ions. If the lightly doped region is formed with P-type impurities, the heavily doped region 45 is formed with impurities being the same as in the lightly doped region. The heavily doped region 45 can also be formed by diffusing impurities through the contact holes 43.

Figure 3D:
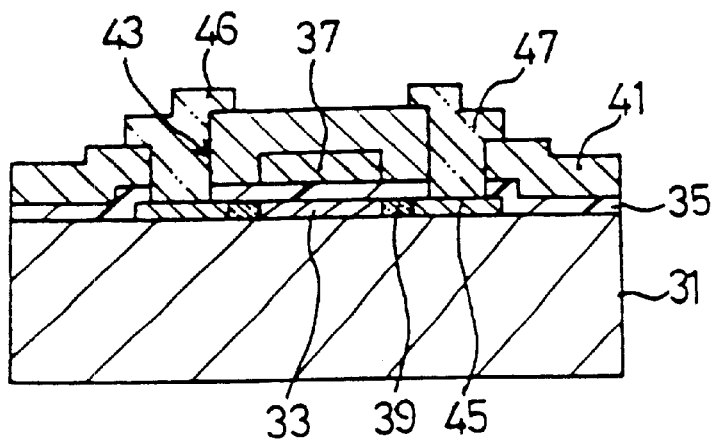

Referring to FIG. 3D, a source electrode 46 and a drain electrode 47 are formed in the contact holes 43 and electrically connected to the heavily doped region 39.

The TFT thus fabricated is a top gate type having the gate 37 on the active layer 33, and also the LDD type having the lightly doped region 39 between the highly doped region 45 and the gate 37.

In addition, an offset type TFT can be formed by leaving out the step of ion implantation which implants ions into the active layer 33 by using the gate 37 as a mask in FIG. 3B.

FIGS. 4A to 4D show another fabricating method of a thin film transistor according to the present invention.

Figure 4A:
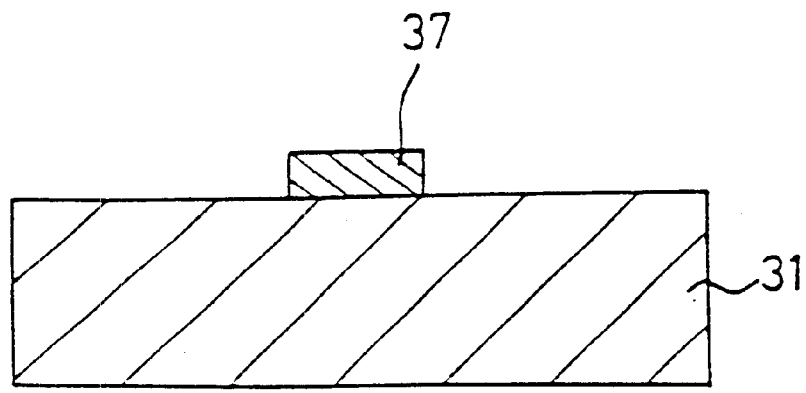
FIGS. 4A to 4D show another fabricating method of thin film transistor according to the present invention.

Referring to FIG. 4A, a conductive metal, such as aluminum, is deposited to a thickness of 3000~4000 Å on a substrate 41 by CVD. A gate 37 is formed by patterning the conductive metal so that a portion of the conductive metal remains on the substrate 31 after the patterning to form the gate 47.

Figure 4B:
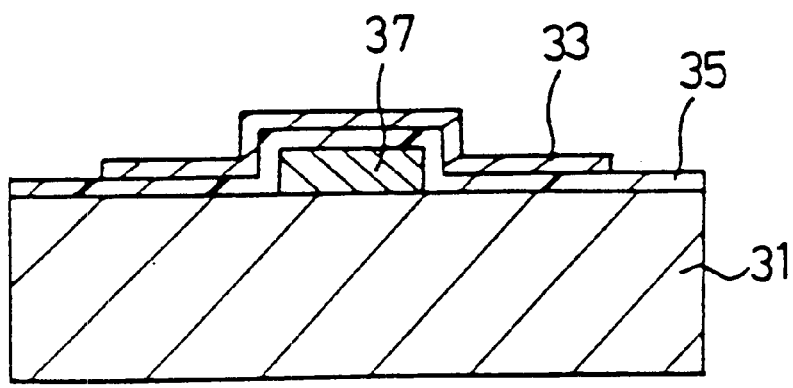

Referring to FIG. 4B, a gate insulation layer 35 is formed by depositing silicon oxide or silicon nitride to a thickness of 800~1200 Å using CVD.

Thereafter, undoped amorphous silicon or undoped polycrystalline silicon is deposited to a thickness of 800~1200 Å using CVD, forming a silicon layer. A portion of the silicon layer remains over the gate 37 in a center of the silicon layer when the silicon layer is patterned using photolithography to define an active layer 33.

Figure 4C:
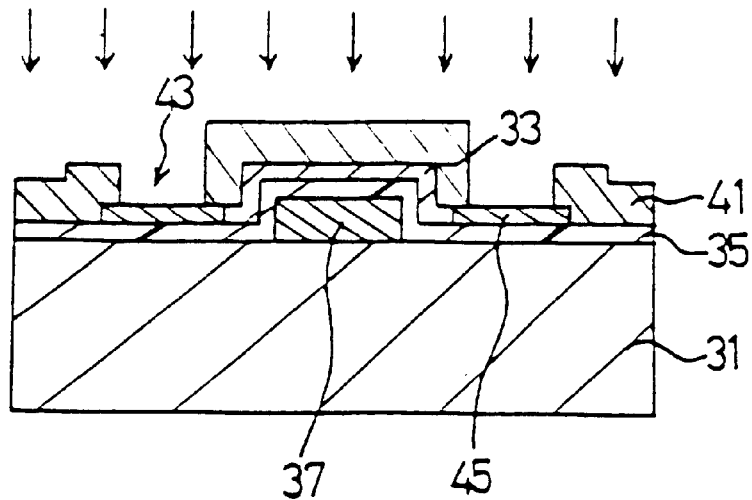

Referring to FIG. 4C, an insulating interlayer 41 is formed by depositing silicon oxide on the gate insulating layer 35 and covering the active layer 33. Contact holes 43 are formed by patterning the insulating interlayer 41 using photolithography to expose portions of the active layer 33.

A heavily doped region 45 is formed by ion implantation or ion diffusion into the exposed portions of the active layer 33 through the contact holes 43 with an implantation dose of $10^{13}$~$10^{14}$/cm$^2$, where the ions implanted or diffused are impurities such as As, P, $BF_2$ or B.

Figure 4D:
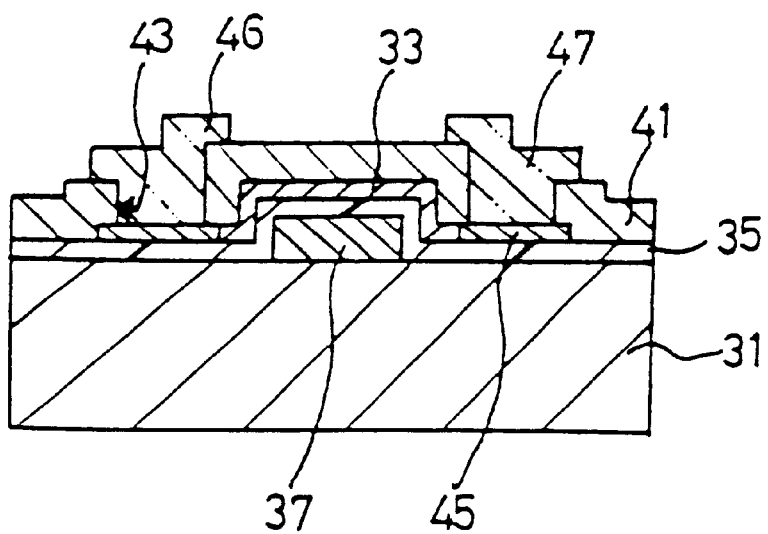

Referring to FIG. 4D, a source electrode 46 and a drain electrode 47 are formed with the source/drain electrodes 46, 47 electrically connected to the heavily doped regions 45 through the contact holes 43.

The TFT of the above method is a bottom gate type TFT having the gate 37 located under the active layer 33, and also an offset type, since the ion implantation of impurities is not done in an LDD type structure between the heavily doped region 45 and the gate 37.

As is explained above, the TFT of the present invention provides a simpler method of fabricating a top gate type TFT where the heavily doped region 45 is formed by doping the impurities into the active layer 33 exposed through the contact holes 43 and without an extra mask.

While the invention has been described in detail and with reference to specific embodiments thereof, it will be apparent to one skilled in the art that various changes and modifications can be made therein without departing from the spirit and scope thereof. Thus, it is intended that the present invention cover the modifications and variations of this invention provided they come within the scope of the appended claims and their equivalents.

What is claimed is:

1. A method of fabricating a thin film transistor comprising the steps of:

forming a gate on a first area of a substrate;

forming a gate insulating layer over the substrate and covering the gate;

forming an active layer on a first portion of the gate insulating layer covering the first area corresponding to the gate;

forming an insulating interlayer on the active layer and a second portion of the gate insulating layer not covered by the active layer;

forming contact holes to expose second areas on the active layer by patterning the insulating interlayer; and forming a highly doped region by highly doping the second areas.

2. The method of claim 1, wherein the step of forming the active layer includes the step of patterning a silicon layer formed of undoped amorphous silicon or undoped polycrystalline silicon.

3. The method of claim 2, wherein the step of forming the active layer includes depositing a silicon layer to a thickness of 800~1200 Å by chemical vapor deposition.

4. The method of claim 1, wherein the active layer is formed so that the gate is located near a center of the active layer.

5. The method of claim 1, wherein the step of forming the heavily doped region includes implanting N-type impurity ions or P-type impurity ions into the active layer.

6. The method of claim 1, wherein the step of forming the heavily doped region includes a step of ion implantation or diffusion into the active layer.

* * * * *